United States Patent
Hsu et al.

(10) Patent No.: US 6,774,498 B2
(45) Date of Patent: Aug. 10, 2004

(54) FLIP-CHIP PACKAGE SUBSTRATE

(75) Inventors: Chi-Hsing Hsu, Taipei Hsien (TW); Jimmy Hsu, Hsin-Tien (TW)

(73) Assignee: VIA Technologies, Inc., Taipei Hsien (TW)

( * ) Notice: Subject to any disclaimer, the term of this patent is extended or adjusted under 35 U.S.C. 154(b) by 0 days.

(21) Appl. No.: 10/225,729

(22) Filed: Aug. 21, 2002

(65) Prior Publication Data

US 2003/0234118 A1 Dec. 25, 2003

(30) Foreign Application Priority Data

Jun. 21, 2002 (TW) .......................................... 91209350

(51) Int. Cl.$^7$ ............................................. H01L 23/48
(52) U.S. Cl. ....................... 257/786; 257/692; 257/778; 257/779; 257/780; 257/738
(58) Field of Search ................................ 257/786, 692, 257/778–780, 738

(56) References Cited

U.S. PATENT DOCUMENTS 6,037,677 A * 3/2000 Gottschall et al. ............ 307/43

* cited by examiner

Primary Examiner—Luan Thai
(74) Attorney, Agent, or Firm—J.C. Patents

(57) ABSTRACT

A flip-chip package substrate layout for reducing plan inductance. The flip-chip package substrate includes a plurality of sequentially stacked wiring layers, at least one insulation layer between two neighboring wiring layers so that the insulation layer and the wiring layers are alternately stacked on top of each other, and a plurality of conductive plugs individually penetrating the insulation layer for electrically connecting the wiring layers. The uppermost wiring layer has at least one power pad region, which has a plurality of power bump pads, while the bottommost wiring layer has a plurality of bonding pads. The position of the power pad region maybe interchanged with the neighboring ground pad region. In addition, two ends of the power pad region may also be extended toward the ground pad region. Hence, the power bump pads located at the two ends of the power pad region are respectively electrically connected to one of the bonding pads through the wiring layers and the conductive plugs.

20 Claims, 5 Drawing Sheets

FLIP-CHIP PACKAGE SUBSTRATE

CROSS-REFERENCE TO RELATED APPLICATION

This application claims the priority benefit of Taiwan application serial no. 91209350, filed Jun. 21, 2002.

BACKGROUND OF THE INVENTION

1. Field of the Invention

The present invention is generally related to a flip-chip package substrate, and particularly to a flip-chip package substrate for reducing plane inductance.

2. Description of Related Art

Flip-chip interconnect technique utilizes an area array to distribute the die pads on the active surface of the die and forms bumps on the die pads. The die is afterwards flipped where the bumps on the die are connected to the contacts of a carrier for external electrical connection. The widespread popularity of flip-chip interconnect method for chip packaging is recognized by its ability to accommodate high pin count packages and the advantage of shrinking the overall package size and shortening the signal transmission paths. The common flip-chip interconnect methods include flip-chip ball grid array (FCBGA), flip-chip pin grid array (FCPGA), and chip on board (COB), and the like.

Please refer to FIG. 1, a conventional FCBGA package structure is shown. A die 10 is provided with a plurality of die pads 14 on the active surface for providing an interface for signal input/output. A plurality of bumps 20 located on die pads 14 are electrically connected to the bump pads 33a of chip package substrate 30. Chip package substrate 30 is formed by alternating a plurality of wiring layers 32 and insulation layers 34, wherein two or more wiring layers 32 are connected by conductive plugs 36 which penetrate insulation layers 34, wherein conductive plugs 36 comprise plating through hole (PTH) 36a and conductive plugs 36b. Furthermore, the bump pads 33a at the uppermost of chip package substrate 30 are formed by the wiring layer 32a which is located at the uppermost of the chip package substrate 30. A patterned solder mask 38a is deposited over wiring layer 32a for protection but exposing bump pads 33a.

Please again refer to FIG. 1, a plurality of bonding pads 33b located on the opposite bottommost of chip package substrate 30 are formed by the wiring layer 32b located at the bottommost of the chip package substrate 30 where a patterned solder mask 38b is deposited over wiring layer 32b for protection but exposing bonding pads 33b. Balls and others electrical structures of the like can be connected to bonding pads 33b for providing further electrical connections. As a result, die pads 14 of die 10 are electrically and mechanically connected to bump pads 33a of the chip package substrate 30 by bumps 20, and further electrically connect down to bonding pads 33b on the bottom of chip package substrate 30 by conductive plugs 36 and wiring layers 32. Bonding pads 33b are further connected to balls 40 for providing electrical and mechanical connection to the next level electrical device such as a printed circuit board (PCB).

Please continue to refer to FIG. 1, due to die pads 14 of die 10 are distributed on the active surface 12 in the form of an area array, bump pads 33a also have to be arranged in the form of an area array on the uppermost layer of chip package substrate 30. Furthermore, bump pads 33a comprise a variety of bump pads of different purposes such as signal bump pads, power bump pads, and ground bump pads, core power/ground bump pads to correspond to the different functions of die pads 14 of die 10.

Please simultaneously refer to FIGS. 1 and 2A, FIG. 2A is a schematic diagram of a conventional layout of the bump pads of a chip package substrate. The conventional layout of bump pads 33a is designed according to the function of bump pads 33a. A core power/ground bump pad 33a is located in the center forming a core power/ground region 110. Surrounding the core power/ground region 110 are different rings of signal, power, and power-to-ground bump pads located adjacent to one another in the shape of a closed ring. A first ring of signal bump pads 120 is formed at the periphery of core power/ground region 110, then a ring of power bump pads 130 at a more outwards periphery, followed by a ring of ground bump pads 140 at an even more outwards periphery, and finally a second ring of signal bump pads 150 located at the most outwards periphery. Furthermore, power bump pads ring 130 further has multiple power bump pads regions 130a, 130b, 130c, and 130d, wherein the first and the last bump pads regions are neighbors because of the ring arrangement. These power bump pads regions 130a, 130b, 130c, and 130d are each a separate power group.

Please simultaneously refer to FIGS. 1 and 2B, FIG. 2B is a schematic diagram of the connection layout of a conventional chip package substrate. For coherence with the bump pads layout in FIG. 2, prior art provides a corresponding bonding pads layout suitable for a chip package substrate for reducing the routing path and plane inductance. A core power/ground region 112 is formed by locating the die pads 33b with core power/ground function in the center of chip package substrate 30. Extending outwards to the periphery of chip package substrate 30 from the core power/ground region 112 is a first signal bump pads coil 122, a power bump pads coil 132, a ground bump pads coil 142, and a second signal bump pads coil 152 at the most outwards periphery. Furthermore, power bump pads ring 132 farther has multiple power bump pads regions 132a, 132b, 132c, and 132d, wherein the first and the last bump pads regions are neighbors because of the ring arrangement. These power bump pads regions 132a, 132b, 132c, and 132d are each a separate power group.

Please refer to FIGS. 1 and 3, FIG. 3 is a schematic diagram of the connection between the external bump pads and balls of a power group. A power group 101 electrically connects through to ball 102 by wiring layers 32 and conductive plugs 36 of chip package substrate 30. Therefore within two ends (as illustrated in circles) of the same power group, a phenomenon known as plane inductance occurs which affects the electrical properties of die 10 after packaging.

SUMMARY OF THE INVENTION

The present invention provides a chip packaging substrate that reduces the effect of plane inductance at two ends of the same power group and effectively limits the amount of synchronous switching noise (SSN) to further increase the electrical properties of the die after packaging.

Improving according to the above purposes, the present invention provides a chip package substrate with a plurality of wiring layers alternating stacked between at least one insulation layer separating the two wiring layers. A plurality of conductive plugs that penetrate the insulation layers provides electrical connection between the separated wiring layers. The uppermost wiring layer further comprises at least one power bump pads region with a plurality of power bump pads, and the bottommost wiring layer further comprises a plurality of power bonding pads. These power bump pads regions can interchange with the neighboring ground bump pads regions, or the ends of the power bump pads regions can extend towards the ground bump pads regions, so the power bump pads on both ends of the power bump pads region can respectively electrically connect to the bonding pads by the wiring layers and conductive plugs.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION OF THE PREFERRED EMBODIMENTS

Figure 1:
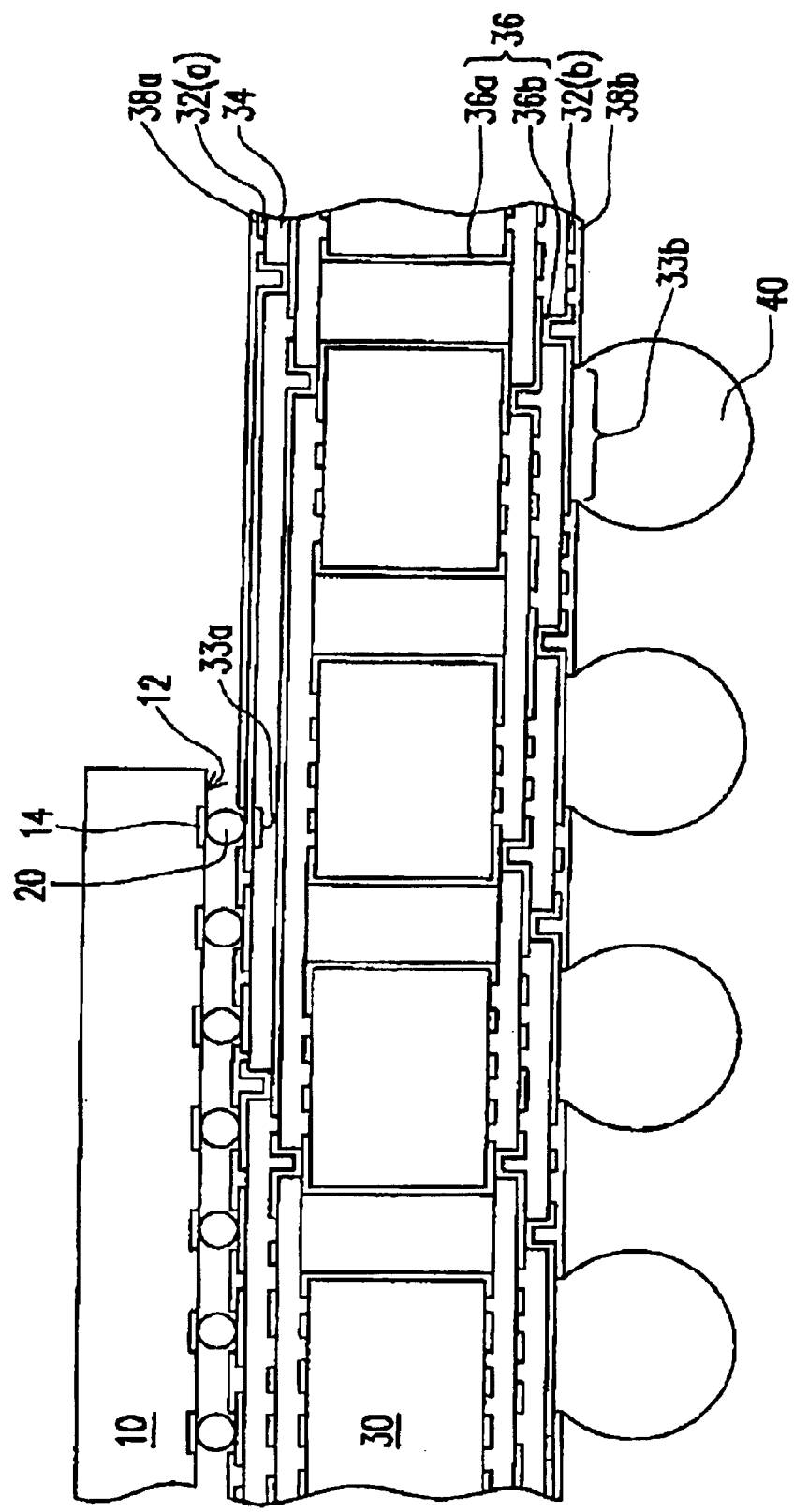
FIG. 1 is a section view of a conventional BGA flip chip package structure.
Figure 2A:
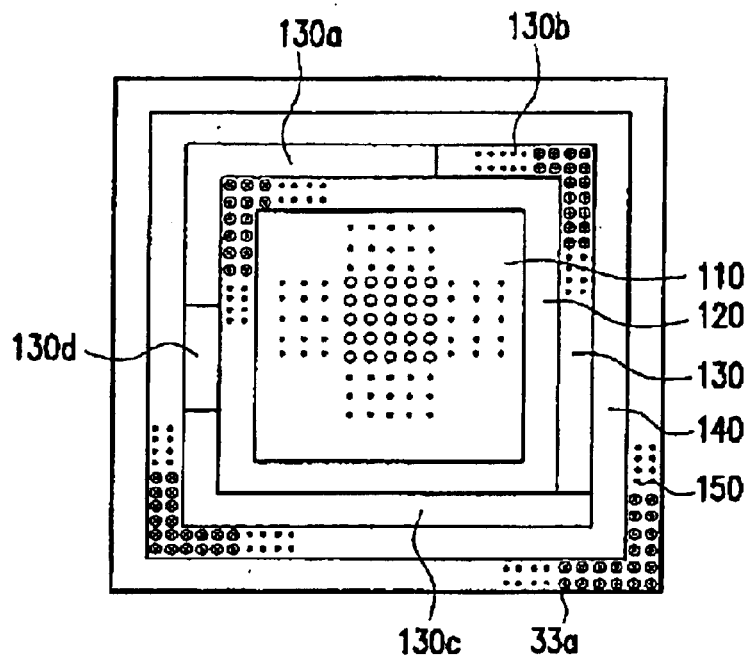
FIG. 2A is a schematic diagram of a conventional layout of bump pads of a conventional flip chip package structure.
Figure 2B:
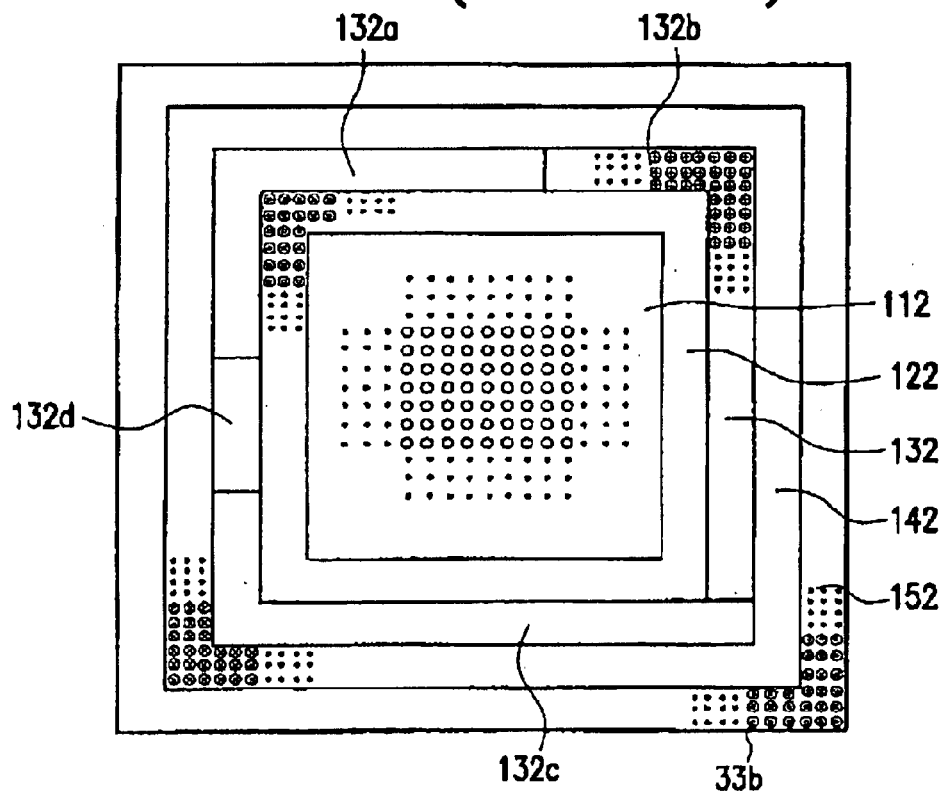
FIG. 2B is a schematic diagram of a conventional layout of bonding pads of a conventional flip chip package structure.
Figure 3:
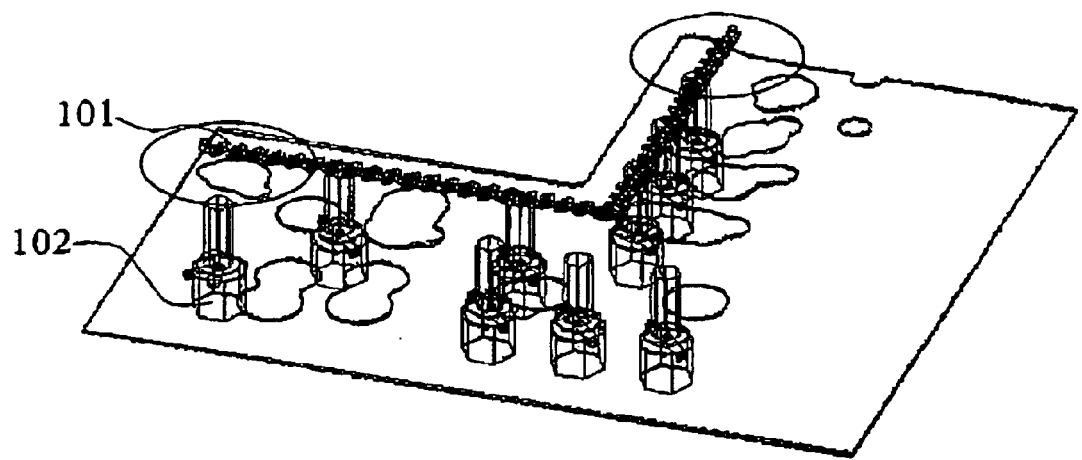
FIG. 3 is a schematic diagram of a conventional connection of the balls and bump pads in the same power group.
Figure 4:
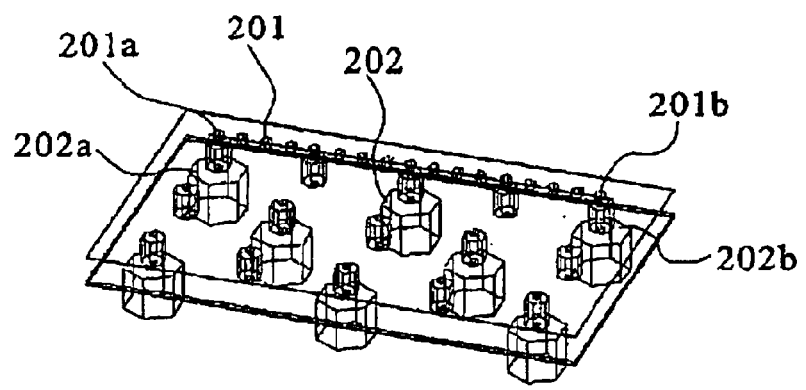
FIG. 4 is a schematic diagram of a novel connection of the balls and bump pads in the same power group according to one preferred embodiment of the present invention.

Please refer to FIG. 2A, the conventional power bump pads ring 130 is formed by a plurality of power bump pads regions 130a, 130b, 130c, and 130d, wherein the first and the last power bump pads regions are neighbors. Each of the bump pads regions 130a, 130b, 130c, and 130d is a separate power group. Furthermore, in order to prevent the two ends of bump pads region 130a, 130b, 130c, or 130d creating a high plane inductance, the present invention provides a structure as illustrated in the schematic diagram of the connection between bump pads and balls at the two ends of the same power group in FIG. 4. The present invention makes the two ends of a power group 201 bump pad 201a and 201b, respectively route downwards to the ball 202a and 202b to reduce the high plane inductance at the two ends of the power group 201. Power bump pads region 130d from FIG. 2A is used as an example. The two bump pads 33a at the end of the same power bump pad regions 130b are respectively and electrically connected by routing to bonding pads 33b through wiring layers 32 and conductive plugs 36 as shown in FIG. 1. As a result, the plane inductance at the two ends of the power bump pads region 130d is reduced and the switching noise is also effectively limited to increase the overall electrical properties of the die.

Figure 5A:
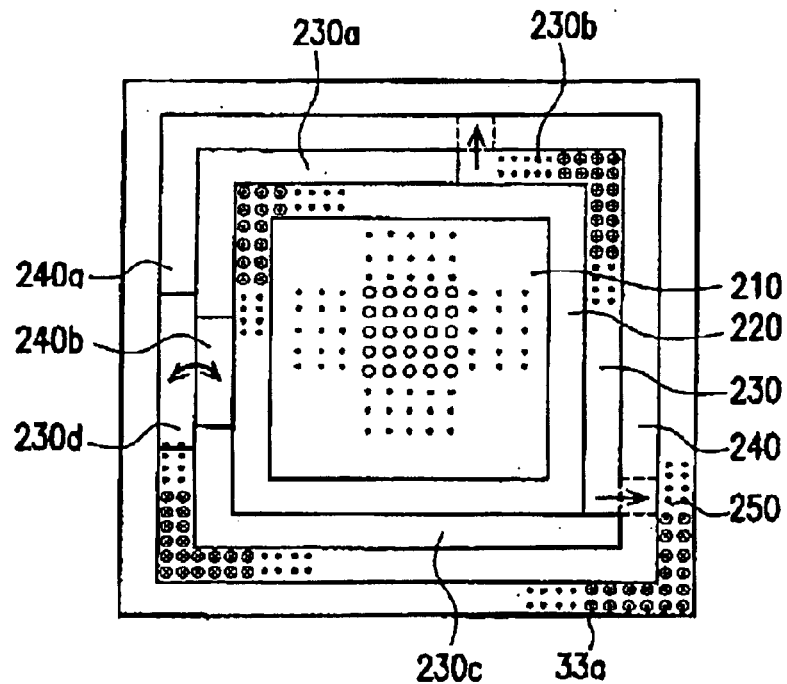
FIG. 5A is a schematic diagram of a novel layout of bump pads of a flip chip package substrate according to a preferred embodiment of the present invention.

Please simultaneously refer to FIGS. 1, 2A, and 5A, FIG. 5A is schematic diagram of the novel layout of the bump pads of a flip chip package substrate according to a preferred embodiment of the present invention. As FIG. 5 illustrates, a first signal bump pads ring 220, a power bump pads ring 230, a ground bump pads ring 240, and a second signal bump pads ring 250 are formed surrounding the core power/ground bump pads region 210 in an outwards extending manner. It is to be noted that there are usually a plurality of bonding pads 33b located underneath power bump pads ring 230 for obtaining the shortest possible electrical path between power bump pads 33a and bonding pads 33b by downwards routing. Bonding pads 33b are further connected to balls 40 or an equivalent electrical structure for providing electrical connection to the external electrical device.

Please simultaneously refer to FIGS. 1, 2A, and 5A, due to the limitation of shortest distance between bonding pads 33b being the size of ball 40, bonding pads that are directly underneath power bump pads ring 130 cannot exactly align with the location of all the end bump pads 33a of all power bump pads regions 130a, 130b, 130c, and 130d in FIG. 2A. As a result, please refer to FIG. 5A, when the ends of a power bump pads region 230d do not have any power bonding pads directly underneath, the power bump pads of this power bump pads region 230d can be interchanged with the ground bump pads of the ground bump pads ring 240 but its functions remain to the original power group. This feature is indicated with a two-headed arrow in FIG. 5A. The interchanged power bump pads region 230d becomes a part of ground bump pads ring 240 but their functions remain as a power bump pads group. Furthermore, the interchanged ground bump pads form a ground bump pads region 240b in the power bump pads ring 230 but their functions remain as ground bump pads. Furthermore, the rest of ground bump pads 33a that have not interchanged with power bump pads in ground bump pads ring 240 form an additional ground bump pads region 240a which is neighbor to the power bump pads region 230d at both ends.

Please again simultaneously refer to FIGS. 1 and 5A, power bump pads region 230d not only can interchange with a region of outer ground bump pads ring 240 but can also interchange with a region of inner signal bump pads ring 220. Furthermore, when ground bump pads ring 220 interchange with the signal bump pads ring 220, power bump pads region 230d can interchange with a region of outer neighbor ground bump pads ring 240 or a region of inner neighbor signal bump pads ring 220. It is to be noted that the present invention is not limited by the configuration of interchangeable regions as illustrated and the preferred embodiment is only used as an example.

Please again simultaneously refer to FIGS. 1 and 5A, the number of bump pads 33a in power bump pads region 230d can be increased by stretching both ends of the power bump pads region 230d following the direction of the ring. Therefore the length of power bump pads region 230d is increased to increase to distribution area and the number of bump pads 33a. As a result, the two ends of the stretched power bump pads region 230d are parallel to power bump pads region 230a and power bump pads region 230c. At the two junction of power bump pads region 230d and power bump pads regions 230a and 230c, the bump pads 33a at one end of power bump pads region 230d are aligned with and parallel to the bump pads 33a of one end of power bump pads region 230a and the bump pads 33a at the other end of power bump pads region 230d are aligned with and parallel to the bump pads 33a of one end of power bump pads region 230c. Therefore the two ends of power bump pads region 230d are separately closer to the corresponding bonding pads 33b to reduce the path between them for increasing the electrical properties of the die 10 after packaging.

Please continue to refer to FIGS. 1 and 5A, it is to be noted that, after power bump pads 33a of one end of power pads region 230d are interchanged, power bump pads 33a at one end of power bump pads region 230d indicate those lying in the to circle formed by sweeping a radius which is the shortest distance between bonding pads with a center of circle at the end point of the power bump pads region 230d. Furthermore, after power bump pads 33a of another end of power pads region 230d are interchanged, power bump pads 33a at another end of power bump pads region 230d indicate those lying in the circle formed by sweeping a radius which is the shortest distance between bonding pads with the center of circle at the end point of the power bump pads region 230d.

In the preferred embodiment of the present invention, besides providing an interchangeability of the bump pads to better align the power bump pads of a power bump pads region to the bonding pads, the present invention also provides an innovative layout for the bump pads of the chip package substrate according to a second embodiment of the present invention.

Please once again simultaneously refer to FIGS. 1 and 5A, power bump pads region 230b of power bump pads ring 230 is used as an example. For the layout of bump pads 33a, the power bump pads 33a at one end or both ends of power bump pads region 230b can extend towards the direction of ground bump pads region 240a for reducing the distance between corresponding power bump pads 33a and power bonding pads 33b, as indicated by single-headed arrows. Therefore power bump pads 33a can be arranged closer to corresponding power bonding pads 33b.

Please refer to FIG. 5A, one end or both ends of power bump pads region 230b not only can extend outwards to ground bump pads region 240a of ground bump pads ring 240, but also can extent inwards to the inner signal bump pads ring 220. Similarly, when ground bump pads ring 240 interchanges with the bump pads ring 220, one end or both ends of power bump pads region 230d can extend to inner neighbor lo ground bump pads ring 240 or outer neighbor signal bump pads ring 220. It is to be noted that the latter is not illustrated in the diagram but disclosed in the preferred embodiment.

In order to decrease the path of the routing wires between the bump pads and bonding pads and the plane inductance, the present invention provides two layouts of the bump pads of a chip package substrate and also a layout for the bonding pads of a chip package substrate.

Figure 5B:
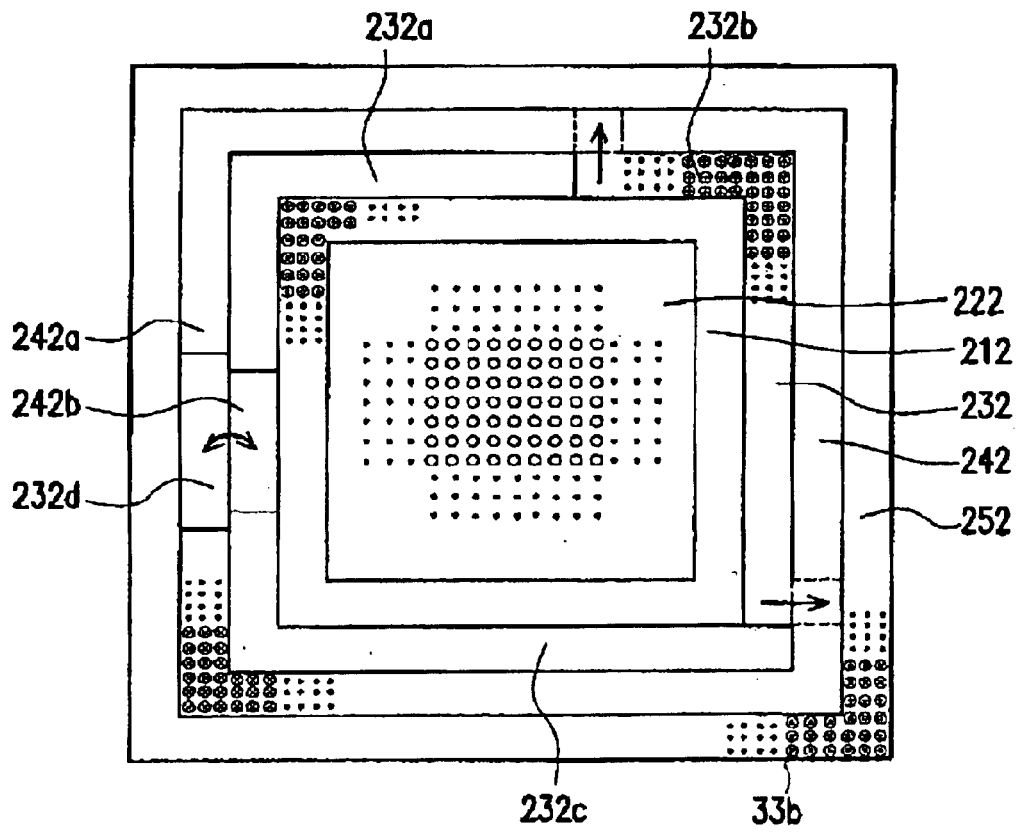
FIG. 5B is a schematic diagram of a novel layout of bonding pads of a flip chip package substrate according to a preferred embodiment of the present invention.

Please refer to FIG. 5B, it is a schematic diagram of the layout of bonding pads of a chip package substrate according to a preferred embodiment of the present invention. The present invention provides a layout of the bonding pads for corresponding to the layout of bump pads in FIG. 5A. Similarly, according to the different functions of bonding pads 33b, a core power/ground bonding pad 33b is located in the center of chip package substrate forming a core power/ground region 212. Surrounding the core power/ground region 212 are different rings of power, and ground and signal, bonding pads located adjacent to one another. Different bonding pads are grouped together according to their functions. A ring of power bonding pads 232 is first formed at the periphery of core power/ground region 212, then a ring of ground bonding pads 242 at a more outwards periphery, followed by a ring of signal bonding pads 252 at the most outwards periphery.

Please simultaneously refer to FIGS. 1, 5A, and 5B, bump pads 33a of first signal bump pads ring 220 and second signal bump pads ring 250 in FIG. 5A can connect by routing to bonding pads 33b of the signal bonding pads ring 252 in FIG. 5B and further electrically connect to external electrical devices by balls 40.

Please again simultaneously refer to FIGS. 1, 5A, and 5B, due to power bump pads 33a of power bump pads region 230d are interchanged with part of ground bump pads 33a of ground bump pads region 240 in FIG. 5A, power bonding pads 33b of power bonding pads region 232d also have to be interchanged with part of ground bonding pads 33b of ground bonding pads ring 242. The functions of the interchanged power bonding pads remain as the power group. The interchanged ground bonding pads form a separate ground bonding pads region 242b in power bonding pads ring 232 but the functions remain as the ground bonding pads. Furthermore, remaining bonding pads 33b in ground bonding pad ring 242 that are not interchanged form a separate ground bonding pads region 242a, wherein it is neighbor with both ends of the power bonding pads 232d.

Please simultaneously refer to FIGS. 1 and 5B, power bonding pads region 232d not only can interchange with bonding pads of the outer neighbor ground bonding pads ring 242 but can also interchange with bonding pads of a neighbor signal bonding pads ring 252 when the ground bonding pads ring 242 interchange with the signal bonding pads ring 252. It is to be noted that this situation is not illustrated in FIG. 5B but is disclosed in the preferred embodiment.

Please again simultaneously refer to FIGS. 1 and 5B, the number bonding pads 33b in power bonding pads region 232d can be increased by stretching both ends of the power bonding pads region 232d following the ring. Therefore the length of power bonding pads region 232d is increased to increase to distribution area and the number of bonding pads 33b. As a result, the two ends of the stretched power bonding pads region 232d are parallel to the power bonding pads region 232a and the power bonding pads region 232c.

Please simultaneously refer to FIGS. 5A and 5B, the layout of bump pads on one end or both ends of power bump pads region 230b extend outwards in FIG. 5A. In order to correspond to the layout of the bump pads, in designing the layout of the bonding pads, one end of both ends of power bonding pads region 232b have to extended correspondingly to ground bonding pads 242b as illustrated by the single-headed arrows in FIG. 5B.

Please again refer to FIG. 5B, power bonding pads region 232d not only can extend outwards to bonding pads of the outer neighbor ground bonding pads ring 242 but can also extend outwards to bonding pads of a neighbor signal bonding pads ring 252 when the ground bonding pads ring 242 interchanges with the signal bonding pads ring 252. It is to be noted that this situation is not illustrated in FIG. 5B but is disclosed in the preferred embodiment.

Figure 6:
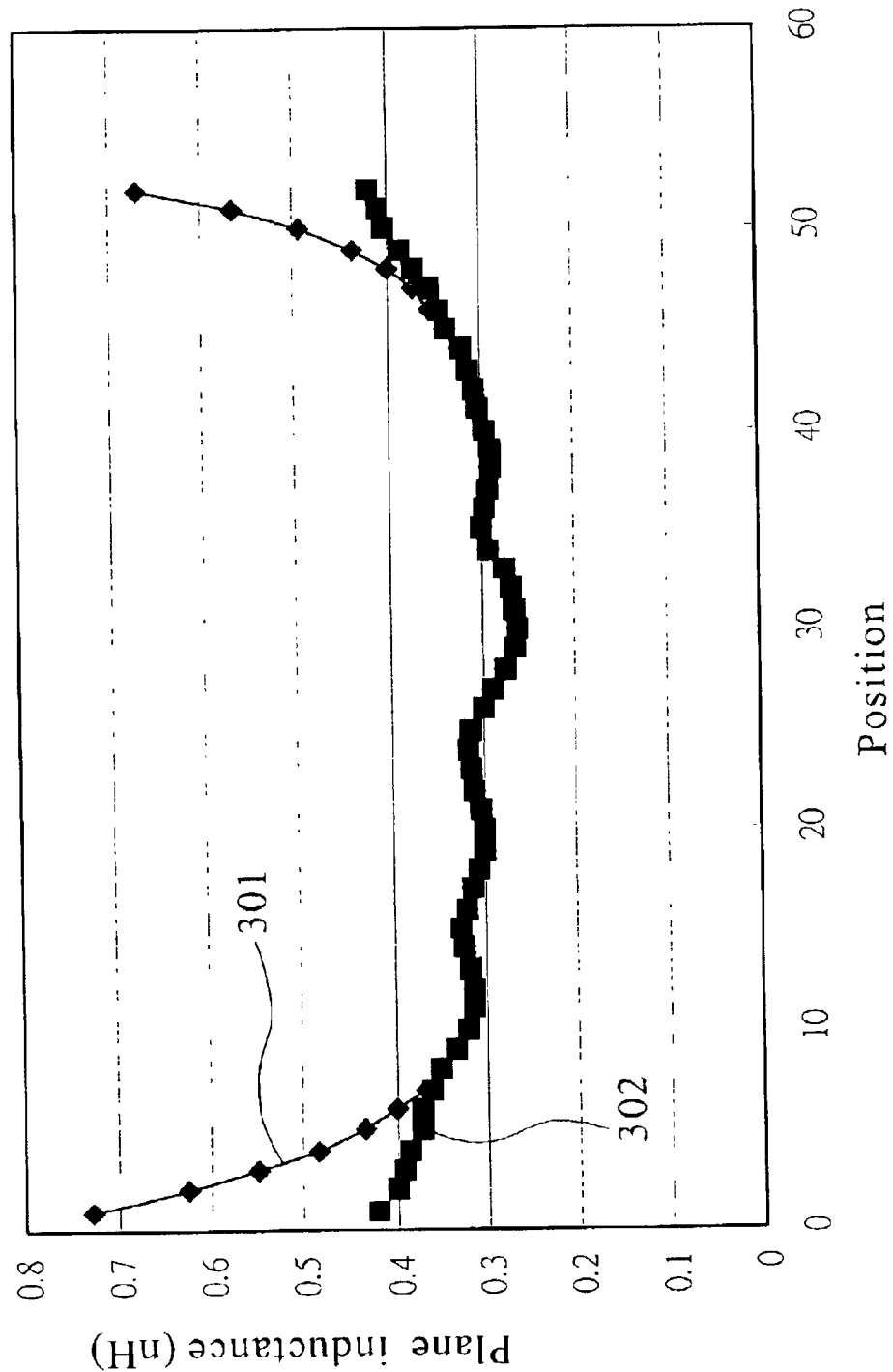
FIG. 6 is a graph showing the comparison of plane inductance between prior art and the present invention.

Please refer to FIG. 6, it shows a comparison of the plane inductance of prior art and the present invention. Curve 301 represents the plane inductance of prior art where the two ends of the curve increase very sharply indicating the plane inductance at the two ends of a power group is very high with synchronous switching noise. Curve 302 represents the plane inductance of the present invention and the two ends of the curve only gradually rise a little. Curve 302 does not posses the sharp spike as found in curve 302 which represent the sudden increase in plane inductance at the two ends of the same power group. Consequently, in comparison, the present invention can effectively and drastically reduce the plane inductance of the ends of the same power group and limit the synchronous switching noise.

The present invention provides a flip chip package substrate where the bump pads of the two ends of a power group can directly connect through routing to the bonding pads. The flip chip package substrate reduces the plane inductance between two ends of the same power group by reducing the routing distance between power bump pads and power bonding pads.

The present invention provides an innovative layout of the bump pads of a flip chip package substrate according to one preferred embodiment of the present invention. The power bump pads region can interchange with a region of bump pads from the ground bump pads ring or the signal bump pads ring. As a result, the bump pads at the two ends of the power bump pads region are closer to the corresponding power bonding pads for reducing the routing distance between the bump pads and the corresponding power bonding pads. The plane inductance at the two ends of a power group is reduced. The layout of the bump pads is also applicable to bonding pads of the chip package substrate.

Furthermore, the second embodiment of the present invention provides a flip chip package substrate where one or both ends of a power bump pads region extend to the neighboring ground bump pads ring or signal bump pads ring. As a result, the power bump pads at the two ends of power bump pads region are closer to the corresponding power bonding pads to reduce the routing distance between the power bump pads and corresponding bonding pads. Therefore the plane inductance at the two ends of a power group is greatly reduced. The layout of the bump pads according to the second embodiment is also applicable to bonding pads of chip package substrate.

Concluding the above, the present invention provides a flip chip package substrate where two ends of a power group connect to the corresponding bonding pads by routing downwards to reduce the problem of high plane inductance at the two ends of the same power group and limit the synchronous switching noise for increasing electrical properties of the die after packaging. The present invention interchanges a power bump pads region with a neighboring ground bump pads region or a neighboring signal bump pads region allowing the power bump pads on both ends to be closer to the corresponding bonding pads according to one embodiment. According to an alternate embodiment, one end or two ends of a power bump pads region extend outwards to the neighboring ground bump pads ring or signal bump pads ring allowing power bump pads on both ends to be closer to the corresponding bonding pads. As a result, the present invention decrease the routing length between the bump pads and the corresponding bonding pads for reducing the plane induction to increase the electrical properties of the die after packaging.

It will be apparent to those skilled in the art that various modifications and variations can be made to the structure and method of the present invention without departing from the scope or spirit of the present invention. In view of the foregoing description, it is intended that the present invention covers modifications and variations of this invention provided they fall within the scope of the following claims and their equivalents.

What is claimed is:

1. A flip chip package substrate, comprising:
   a plurality of wiring layers stacked sequentially;
   at least one insulation layer located between two neighboring wiring layers for providing electrical insulation between the wiring layers, wherein each insulation layer and each wiring layer are stacked alternatively; and
   a plurality of conductive plugs that penetrate the insulation layers for providing electrical connection between the wiring layers,
   wherein an uppermost wiring layer comprising a first bump pads ring and a second bump pads ring, and the first bump pads ring and the second bump pads ring being contiguous to each other and concentric to a core bump pad region,
   wherein the first bump pads ring comprises a plurality of power bump pads regions and at least a a ground bump pads region, and any two adjacent bump pads regions of the first bump pads ring adjoin to each other end to end, and wherein each power bump pads region of the first bump pads ring further comprises a plurality of power bump pads and the ground bump pads region of the first bump pads ring comprises a plurality of ground bump pads,
   wherein the second bump pads ring comprises a plurality of ground bump pads regions and at least a power bump pads region, and any two adjacent bump pads regions of the second bump pads ring adjoin to each other end to end, and wherein each ground bump pads region of the second bump pads ring further comprises a plurality of ground bump pads and the power bump pads region of the second bump pads ring comprises a plurality of power bump pads,
   wherein the power bump pads region of the second bump pads ring is adjoining to and parallel to the ground bump pads region of the first bump pads ring.

2. The substrate in claim 1, wherein a bottommost wiring layer comprising a plurality of bonding pads, one of the power bump pads on one end of the power bump pads region of the second bump pads ring is electrically connected to the one of the bonding pads by the wiring layers and the conductive plugs, and one of the power bump pads on another end of the power bump pads region of the second bump pads ring is electrically connected to the one of the bonding pads by the wiring layers and the conductive plugs.

3. The substrate in claim 1, wherein a bottommost wiring layer comprising a first bonding pads ring and a second bonding pads ring, the first bonding pads ring and the second bonding pads ring being contiguous to each other and concentric to a core bonding pad region, wherein the first bonding pads ring comprises a plurality of power bonding pads regions further comprising a plurality of power bonding pads and at least a ground bonding pads region, comprising a plurality of ground bonding pads, any two adjacent bonding pads regions of the first bonding pads ring adjoin to each other end to end, and wherein the second bonding pads ring comprises a plurality of ground bonding pads regions further comprising a plurality of ground bonding pads and at least a power bonding pads region, comprising a plurality of power bonding pads, any two adjacent bonding pads regions of the second bonding pads ring adjoin to each other end to end, wherein the power bonding pads region of the second bonding pads ring is adjoin to and parallel to the ground bonding pads region of the first bonding pads ring.

4. The substrate in claim 1, wherein a bottommost wiring layer comprising a plurality of bonding pads, the power bump pads at each end of the power bump pads region of the second bump pads ring are lying in a circle formed by sweeping a radius which is a shortest distance between the bonding pads with a center of the circle at the end point of the power bump pads region of the second bump pads ring.

5. A flip chip package substrate, comprising:
   a plurality of wiring layers stacked sequentially;
   at least one insulation layer located between two neighboring wiring layers for providing electrical insulation between the wiring layers, wherein each insulation layer and each wiring layer are stacked alternatively; and
   a plurality of conductive plugs that penetrate the insulation layers for providing electrical connection between the wiring layers,
   wherein an uppermost wiring layer comprising a first bump pads ring and a second bump pads ring, and the first bump pads ring and the second bump pads ring being contiguous to each other and concentric to a core bump pad region,
   wherein the first bump pads ring comprises a plurality of power bump pads regions and any two adjacent power bump pads regions of the first bump pads ring adjoin to each other end to end, and each power bump pads region further comprises a plurality of power bump pads, wherein the second bump pads ring comprises a plurality of ground bump pads regions and at least one power bump pads region and each of the ground bump pads regions further comprises a plurality of ground bump pads and the power bump pads region of the second bump pads ring comprises a plurality of power bump pads, wherein the power bump pads region of the second bump pads ring adjoins to one of the power bump pads regions of the first bump pads ring, wherein the power bump pads region of the second bump pads ring and the one of the power bump pads regions of the first bump pads ring adjoined to the power bump pads region of the second bump pads ring belong to a same power group set.

6. The substrate in claim 5, wherein a bottommost wiring layer comprising a plurality of bonding pads, one of the power bump pads on one end of the power bump pads region of the second bump pads ring is electrically connected to the one of the bonding pads by the wiring layers and the conductive plugs, and one of the power bump pads on another end of the power bump pads region of the first bump pads ring is electrically connected to the one of the bonding pads by the wiring layers and the conductive plugs.

7. The substrate in claim 5, wherein a bottommost wiring layer comprises a first bonding pads ring and a second bonding pads ring, the first bonding pads ring and the second bonding pads ring being continuous to each other and concentric to a core bonding pad region, the fist bonding pads ring comprises a plurality of power bonding pads regions further comprising a plurality of power bonding pads, and the second bonding pads ring comprises a plurality of ground bonding pads regions further comprising a plurality of ground bonding pads and at least one power bonding pads region comprising a plurality of power bonding pads, wherein the power bonding pads region of the second bonding pads ring adjoins to one of the power bonding pads region of the first bonding pads ring.

8. A flip chip package substrate, comprising:

a plurality of wiring layers stacked sequentially;

at least one insulation layer located between two neighboring wiring layers for providing electrical insulation between the wiring layers, wherein each insulation layer and each wiring layer are stacked alternatively, and a plurality of conductive plugs that penetrate the insulation layers for providing electrical connection between the wiring layers, wherein an uppermost wiring layer comprising a first bump pads ring and a second bump pads ring, and the first bump pads ring and the second bump pads ring being contiguous to each other and concentric to a core bump pad region, wherein the first bump pads ring comprises a plurality of power bump pads regions and at least a signal bump pads region, and any two adjacent bump pads regions of the first bump pads ring adjoin to each other end to end, and wherein each power bump pads region of the first bump pads ring further comprises a plurality of power bump pads and the signal bump pads region of the first bump pads ring comprises a plurality of signal bump pads, wherein the second bump pads ring comprises a plurality of signal bump pads regions and at least a power bump pads region, and any two adjacent bump pads regions of the second bump pads ring adjoin to each other end to end, and wherein each signal bump pads region of the second bump pads ring further comprises a plurality of signal bump pads and the power bump pads region of the second bump pads ring comprises a plurality of power bump pads, wherein the power bump pads region of the second bump pads ring is adjoining to and parallel to the signal bump pads region of the first bump pads ring.

9. The substrate in claim 8, wherein a bottommost wiring layer comprising a plurality of bonding pads, one of the power bump pads on one end of the power bump pads region of the second bump pads ring is electrically connected to the one of the bonding pads by the wiring layers and the conductive plugs, and one of the power bump pads on another end of the power bump pads region of the second bump pads ring is electrically connected to the one of the bonding pads by the wiring layers and the conductive plugs.

10. The substrate in claim 8, wherein the bottommost wiring layer comprising a first bonding pads ring and a second bonding pads ring, the first bonding pads ring and the second bonding pads ring being contiguous to each other and concentric to a core bonding pad region, wherein the first bonding pads ring comprises a plurality of power bonding pads regions further comprising a plurality of power bonding pads and at least a signal bonding pads region, comprising a plurality of signal bonding pads, any two adjacent bonding pads regions of the first bonding pads ring adjoin to each other end to end, and wherein the second bonding pads ring comprises a plurality of signal bonding pads regions further comprising a plurality of signal bonding pads and at least a power bonding pads region, comprising a plurality of power bonding pads, any two adjacent bonding pads regions of the second bonding pads ring adjoin to each other end to end, wherein the power bonding pads region of the second bonding pads ring is adjoining to and parallel to the signal bonding pads region of the first bonding pads ring.

11. The substrate in claim 8, wherein a bottommost wiring layer comprising a plurality of bonding pads, the power bump pads at each end of the power bump pads region of the second bump pads ring are lying in a circle formed by sweeping a radius which is a shortest distance between the bonding pads with a center of the circle at the end point of the power bump pads region of the second bump pads ring.

12. A flip chip package substrate, comprising:

a plurality of wiring layers stacked sequentially;

at least one insulation layer located between two neighboring wiring layers for providing electrical insulation between the wiring layers, wherein each insulation layer and each wiring layer are stacked alternatively, and a plurality of conductive plugs that penetrate the insulation layers for providing electrical connection between the wiring layers, wherein an uppermost wiring layer comprising a first bump pads ring and a second bump pads ring, and the first bump pads ring and the second bump pads ring being contiguous to each other and concentric to a core bump pad region, wherein the first bump pads ring comprises a plurality of power bump pads regions and any two adjacent power bump pads regions of the first bump pads ring adjoin to each other end to end, and each power bump pads region further comprises a plurality of power bump pads, wherein the second bump pads ring comprises a plurality of signal bump pads regions and at least one power bump pads region and each of the signal bump pads regions further comprises a plurality of signal bump pads and the power bump pads region of the second bump pads ring comprises a plurality of power bump pads, wherein the power bump pads region of the second bump pads ring adjoins to one of the power bump pads regions of the first bump pads ring, wherein the power bump pads region of the second bump pads ring and the one of the power bump pads regions of the first bump pads ring adjoined to the power bump pads region of the second bump pads ring belong to a same power group set.

13. The substrate in claim 12, wherein a bottommost wiring layer comprising a plurality of bonding pads, one of the power bump pads on one end of the power bump pads region of the second burnt pads ring is electrically connected to the one of the bonding pads by the wiring layers and the conductive plugs, and one of the power bump pads on another end of the power bump pads region of the first bump pads ring is electrically connected to the one of the bonding pads by the wiring layers and the conductive plugs.

14. The substrate in claim 12 wherein a bottommost wiring layer comprises a first bonding pads ring and a second bonding pads ring, the first bonding pads ring and the second bonding pads ring being contiguous to each other and concentric to a core bonding pad region, the first bonding pads ring comprises a plurality of power bonding pads regions further comprising a plurality of power bonding pads, and the second bonding pads ring comprises a plurality of signal bonding pads regions further comprising a plurality of signal bonding pads and at least one power bonding pads region comprising a plurality of power bonding pads, wherein the power bonding pads region of the second bonding pads ring adjoins to one of the power bonding pads region of the first bonding pads ring.

15. A flip chip package substrate, comprising:

a plurality of wiring layers stacked sequentially;

at least one insulation layer located between two neighboring wiring layers for providing electrical insulation between the wiring layers, wherein each insulation layer and each wiring layer are stacked alternatively, and a plurality of conductive plugs that penetrate the insulation layers for providing electrical connection between the wiring layers, wherein an uppermost wiring layer comprising a first ring of bump pads and a second ring of bump pads, and the first ring of bump pads and the second ring of bump pads being abutting to each other and concentric to a core bump pad region, wherein the first ring of bump pads comprises a plurality of first bump pads regions and at least a second bump pads region, and any two adjacent bump pads regions of the first ring of bump pads adjoin to each other end to end, wherein the second ring of bump pads comprises a plurality of second bump pads regions and at least a first bump pads region, and any two adjacent bump pads regions of the second bump pads ring adjoin to each other end to end, and wherein each second bump pads region comprises a plurality of second bump pads and each first bump pads region comprises a plurality of first bump pads, wherein the first bump pads region of the second ring of bump pads is adjoining to and parallel to the second bump pads region of the first ring of bump pads, wherein a bottommost wiring layer comprising a plurality of bonding pads, one of the first bump pads on one end of the first bump pads region of the second ring of bump pads is electrically connected to the one of the bonding pads by the wiring layers and the conductive plugs, and one of the first bump pads on another end of the first bump pads region of the second ring of bump pads is electrically connected to the one of the bonding pads by the wiring layers and the conductive plugs, and wherein the first bump pads at each end of the first bump pads region of the second ring are lying in a circle formed by sweeping a radius which is a shortest distance between the bonding pads with a center of the circle at the end point of the first bump pads region of the second ring.

16. The substrate in claim 15, wherein the bottommost wiring layer comprising a first bonding pads ring and a second bonding pads ring, the first bonding pads ring and the second bonding pads ring being contiguous to each other and concentric to a core bonding pad region, wherein the first bonding pads ring comprises a plurality of first bonding pads regions further comprising a plurality of first bonding pads and at least a second bonding pads region, comprising a plurality of second bonding pads, any two adjacent bonding pads regions of the first bonding pads ring adjoin to each other end to end, and wherein the second bonding pads ring comprises a plurality of second bonding pads regions further comprising a plurality of second bonding pads and at least a first bonding pads region, comprising a plurality of first bonding pads, any two adjacent bonding pads regions of the second bonding pads ring adjoin to each other end to end, wherein the first bonding pads region of the second bonding pads ring is adjoining to and parallel to the second bonding pads region of the first bonding pads ring.

17. The substrate in claim 16, wherein the first bonding pads are power bonding pads, while the second bonding pads are ground bonding pads.

18. The substrate in claim 16, wherein the first bonding pads are power bonding pads, while the second bonding pads are signal bonding pads.

19. The substrate in claim 15, wherein the fist bump pads are power bump pads, while the second bump pads are ground bump pads.

20. The substrate in claim 15, wherein the first bump pads are power bump pads, while the second bump pads are signal bump pads.

* * * * *